United States Patent
Shin

(10) Patent No.: US 7,917,794 B2
(45) Date of Patent: Mar. 29, 2011

(54) METHOD FOR OPTIMIZING A DSP INPUT CLOCK USING A COMPARING/ANALYZING CIRCUIT

(75) Inventor: Seoung Chul Shin, Seoul (KR)

(73) Assignee: Transpacific Sonic, LLC, Wilmington, DE (US)

( * ) Notice: Subject to any disclaimer, the term of this patent is extended or adjusted under 35 U.S.C. 154(b) by 968 days.

(21) Appl. No.: 10/545,505

(22) PCT Filed: Mar. 24, 2004

(86) PCT No.: PCT/KR2004/000655
§ 371 (c)(1),
(2), (4) Date: Feb. 5, 2007

(87) PCT Pub. No.: WO2004/086621
PCT Pub. Date: Oct. 7, 2004

(65) Prior Publication Data
US 2007/0153948 A1    Jul. 5, 2007

(30) Foreign Application Priority Data
Mar. 25, 2003  (KR) .................. 10-2003-0018553

(51) Int. Cl.
*G06F 1/00*    (2006.01)
(52) U.S. Cl. .................. 713/500; 713/502; 713/600
(58) Field of Classification Search .................. 713/500, 713/503, 600
See application file for complete search history.

(56) References Cited

U.S. PATENT DOCUMENTS

| | | |
|---|---|---|
| 5,300,830 A | 4/1994 | Hawes |
| 5,521,529 A | 5/1996 | Agrawal et al. |
| 5,999,014 A | 12/1999 | Jacobson et al. |
| 6,028,463 A | 2/2000 | Albu et al. |
| 7,016,403 B2 * | 3/2006 | Hirt et al. ............. 375/224 |

(Continued)

FOREIGN PATENT DOCUMENTS
WO    2004/086221    10/2004

OTHER PUBLICATIONS

International Search Report for PCT/KR2004/000655 mailed Jun. 29, 2004.
Supplementary European Search Report for EP 04723087.5 (PCT/KR2004/000655) dated May 28, 2010.

(Continued)

*Primary Examiner* — Thomas Lee
*Assistant Examiner* — Jaweed A Abbaszadeh
(74) *Attorney, Agent, or Firm* — McDonnell Boehnen Hulbert & Berghoff LLP

(57) ABSTRACT

A method optimizes a DSP Input clock using a clock comparing/analyzing circuit. The method of the present invention enables PLD to select a delay function of the PLD and signals from a plurality of patterns, in addition to varying three elements' values of R, L and C, a driver delay, and a characteristic change by peripheral elements of patterns that a clock passes to thereby obtain an optimal characteristic. Particularly, the inventive method provides an optimal clock with the best performance among clocks from the pattern. This method has the following two functions: (1) allowing the paths from a plurality of patterns to be scanned individually and a pattern having the lowest noise level to be searched; (2) searching the maximum SNR(Signal to Noise) value by providing a delay offset to an optimal path having the lowest noise level which is searched from the first function, and wherein an optimal path is searched and connected by checking the operation periodically by a timer to provide optimal characteristics in case peripheral environments change.

20 Claims, 2 Drawing Sheets

U.S. PATENT DOCUMENTS

| | | | |
|---|---|---|---|
| 7,047,504 B2 * | 5/2006 | Kawano | 716/2 |
| 2002/0031093 A1 * | 3/2002 | Gfeller et al. | 370/252 |
| 2002/0095628 A1 * | 7/2002 | Lee | 714/700 |
| 2004/0123259 A1 * | 6/2004 | You et al. | 716/6 |
| 2004/0128579 A1 * | 7/2004 | Khondker et al. | 713/500 |

OTHER PUBLICATIONS

Response to Communication dated Jun. 24, 2010 as filed in European Application No. 04723087.5 on Aug. 16, 2010.

* cited by examiner

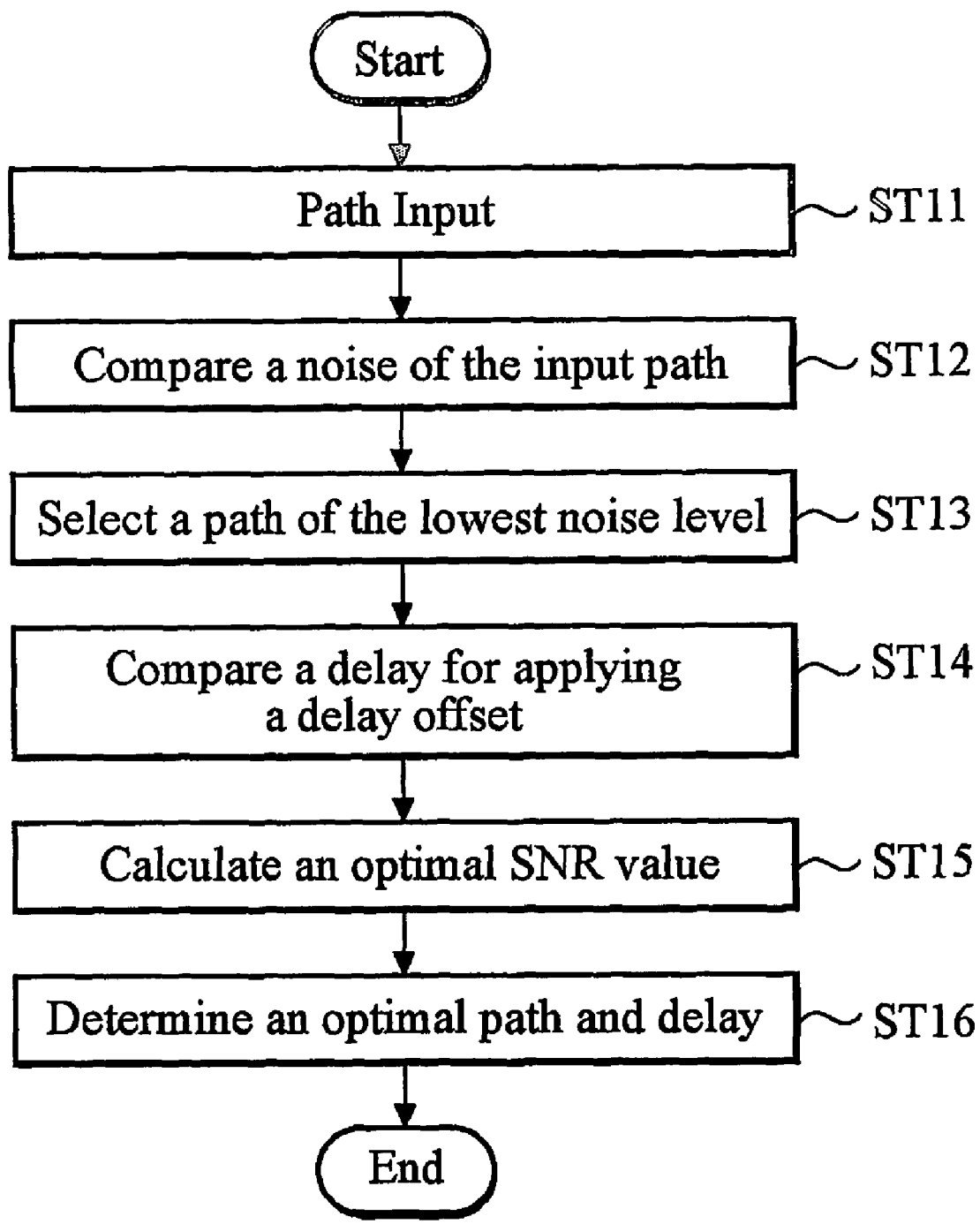

METHOD FOR OPTIMIZING A DSP INPUT CLOCK USING A COMPARING/ANALYZING CIRCUIT

TECHNICAL FIELD

The present invention relates to a method of optimizing a digital signal processor (DSP) input clock using a clock comparing/analyzing circuit. Particularly, the method of the present invention enables a programmable logic device (PLD) to select a delay function of the PLD and signals from a plurality of patterns, in addition to varying three elements' values of R, L and C, a driver delay, and a characteristic change by peripheral elements of patterns that a clock passes to thereby obtain an optimal characteristic.

More particularly, the inventive method provides an optimal clock having the best performance among clocks from the pattern. This method has the following two functions: (1) allowing the paths from a plurality of patterns to be scanned individually and a pattern having the lowest noise level to be searched; and (2) searching the maximum SNR (Signal to Noise) value by providing a delay offset to an optimal path having the lowest noise level which is searched from the first function, wherein an optimal path is searched and connected by checking the operation periodically by a timer to provide optimal characteristics in case peripheral environments change.

BACKGROUND ART

In a board which employs an A/D or D/A converter and processes digital signals by DSP, a plurality of clocks supplied from a clock source through a clock driver have different phases and characteristics according to a clock pattern path to destination. Accordingly, the DSP latching data significantly affects the entire signal-to-noise ratio (SNR) or performance depending on what kind of clock is used.

The elements that change a clock's characteristic and delay in a conventional development are divided into three elements. The first element is values of R, L and C. The second element is a driver delay. The third element is a characteristic change by elements peripheral to pattern that a clock passes. These three elements are difficult to change once they are designed and a printed circuit board (PCB) is manufactured.

In this regard, a developer has to inevitably expend extensive costs and time since he must manufacture a plurality of PCBs. Furthermore, the developer is severely inconvenienced as he must change the values of R, L and C elements directly whenever any delicate external changes occur.

More specifically, this is because a clock characteristic and a board which employs an A/D or D/A converter and processes digital signals by DSP must change and test a clock element until a desired specification is obtained in order to design and manufacture the board. Therefore, a plurality of PCBs must be manufactured and be tested whenever each element changes.

Further, the characteristics of the PCBs tend to change due to the manufacturing environment although the PCBs of a desired specification are intended. Therefore, a delicate difference from one board to another board may be overcome by changing the values of R, L and C elements in order to optimize the characteristic change.

For the above reasons, a developer must expend significant costs and time since he must manufacture a plurality of PCBs and change the values of R, L and C elements directly whenever the delicate external changes are encountered.

DISCLOSURE OF THE INVENTION

The objective of the present invention is to provide a method for optimizing a DSP input clock using a clock comparing/analyzing circuit so that an optimal characteristic can be obtained by enabling three elements' values of R, L and C, a driver delay and a characteristic change by peripheral elements of patterns that a clock passes to change. The optimal characteristic can be provided by checking said operation periodically through a timer and by searching and connecting the optimal path even though peripheral environments are changed.

To accomplish the above-mentioned objective, the method for optimizing a DSP comprises the following steps of: comparing noises of paths when the paths are inputted from a plurality of patterns; selecting a path of the lowest noise level based on the comparison result; applying a delay offset to the selected path; calculating a maximum SNR value; and determining an optimal path and delay.

Further, to accomplish the object of the present invention, the method further comprises a step of checking said operation periodically by a timer and automatically searching and connecting the optimal path.

According to the present invention, a pattern of the lowest noise level is searched by scanning the paths from a plurality of patterns individually. The maximum SNR value is searched by applying a delay offset to the optimal path having the lowest noise level. The optimal path is searched and connected by checking said operation periodically by a timer. By doing so, the optimal characteristic can be provided even though peripheral environments change.

Further, the clock path in the optimized situation can be searched when a test bench board is developed to initially test through said configuration. In case various situations are changed after the fixed PCB is manufactured, the optimal situation can be detected and the optimal SNR can be obtained by applying a corresponding compensation.

Further, through the above advantages, a developer can reduce development costs. The developer can also remove a work that should set up accordingly. Additionally, a path and SNR of the best characteristic can be provided even when the manufactured board is significantly changed.

BRIEF DESCRIPTION OF DRAWINGS

FIG. 3 is a flow chart illustrating a method for optimizing a DSP input clock using a clock comparing/analyzing circuit according to the present invention.

BEST MODE FOR CARRYING OUT THE INVENTION

The embodiment of the present invention will be described with reference to the accompanying drawings in accordance with the above-identified technical scope of the present invention.

At first, the present invention can search a clock path in the optimized situation when a test bench board is developed for a change of environment and an initial test. In case various situations are changed after the fixed PCB is manufactured, the invention can apply the corresponding compensation. By doing so, the invention can detect the optimized situation and obtain the optimized SNR.

Generally, characteristic of an input clock and quality of a waveform are an important element that determines the whole SNR in a board using a DSP and an A/D converter. A sampling noise occurs according to a timing latched by a clock where it is coupled with a quantization noise and becomes a larger noise element. Further, when a delay and phase between a clock inputted to an A/D converter and a clock inputted to the DSP are changed while being transmitted to the path according to external elements, data processed in the DSP can be recognized as different data.

Therefore, a developer changes and tests paths that a clock passes in order to select and use a clock unavoidably passing between high-speed digital data and important data in an optimum way.

Therefore, the present invention provides a method which can obtain an optimal path and a maximum SNR by using a PLD and other additional elements that perform the above operations and comparing values of the scanned path through a CPU. The invention is largely divided into two operations.

Figure 1:
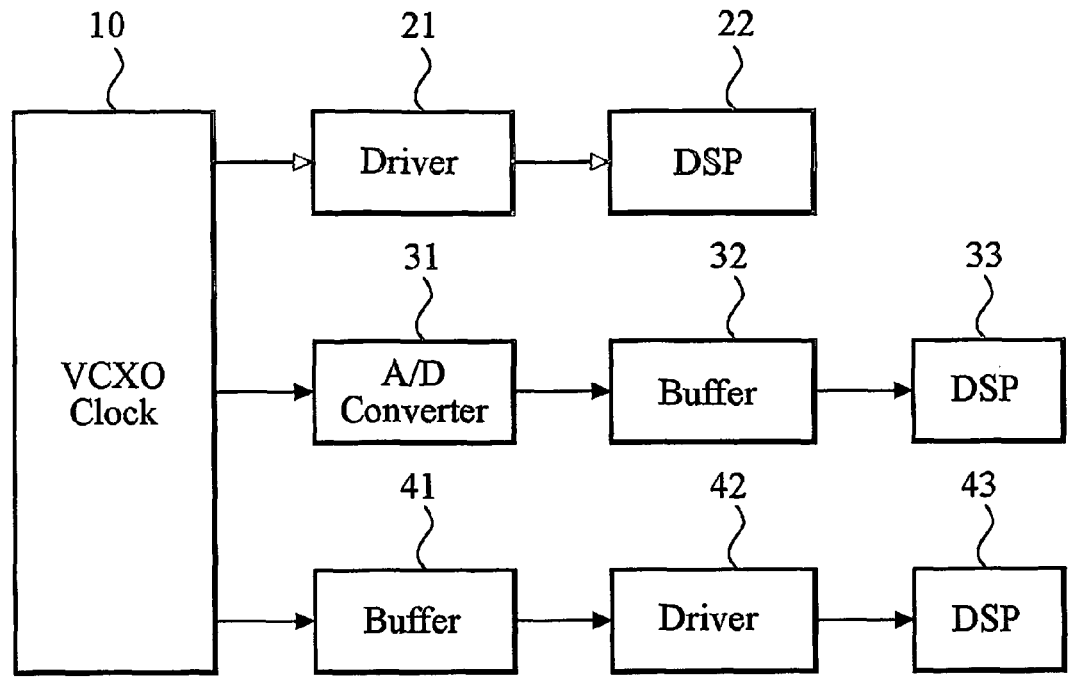
FIG. 1 shows a block diagram of a system for optimizing a DSP input clock using a clock comparing/analyzing circuit according to the present invention.
Figure 2:
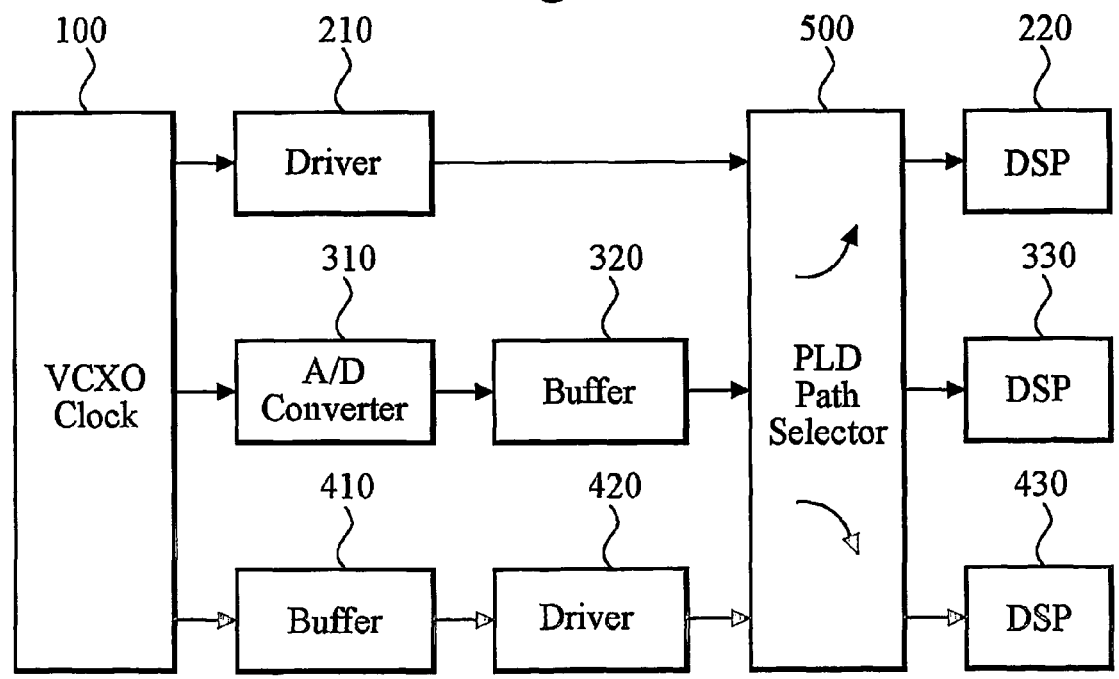
FIG. 2 shows a block diagram of another system for optimizing a DSP input clock using a clock comparing/analyzing circuit according to the present invention.

FIG. 1 and FIG. 2 show block diagrams of systems for optimizing a DSP input clock using a clock comparing/analyzing circuit according to the present invention.

In the first step, the inventive method of optimizing the DSP input clock using the clock comparing/analyzing circuit searches a path of the lowest noise level among a plurality of paths that a clock passes. The clock is inputted from a VCXO (10) to DSP (22, 33, 43) and A/D converter (31) through three paths as shown in FIG. 1.

As shown in FIG. 2, the clock passes through different paths. The clock input through each path is inputted to DSP (22, 33, 43) through a PLD (500).

Further, a circuit, which is configured as shown in FIG. 2, has the three paths and reads out a RSSI (Received Signal Strength Indicator) value from a Rx DSP. The RSSI value means an AGC gain within DSP (220, 330, 430) and can be represented by the following: Gain(x)=Gain(x−1)+Error_out (x). That is, it is a function that is affected by the gain of the previous step.

Here, the Rx DSP adjusts a signal to a definite level using the AGC value. That is, if a signal of low level is inputted, then the Rx DSP has a high AGC value. If a signal of high level is inputted, then it has a low AGC value. Using this, an initial noise level can be measured.

Meanwhile, characteristics of input clock as mentioned above are important so as to have the Rx input signal of the lowest noise level. In order to search the characteristics of the input clock, it is set so that there are no signals to the Rx input. The AGC of the three paths shown in FIG. 2 is measured and the path having the largest AGC value is searched.

PLD (500) connects the path having the largest AGC value based on the AGC values which are measured by means of an input path and an output path to the DSP for each path. This can be simply embodied by making a comparing program with C language in AP.

Here, if the result carrying out the embodied program is as the following, then (1) a path having the highest AGC value corresponds to a path having the lowest noise level and (2) PLD (500) will connect the path of the lowest noise level after comparing the three paths.

Best Path=Path2 (Selected Path is Path1)
    AGC value of DSP for Path1: 741b!!
    AGC value of DSP for Path2: 543c!!
    AGC value of DSP for Path3: 562a!!

In fact, a noise level of the path is close to about −80 dBm. At the second step, when the path of the lowest noise level has been determined, the method that gives a delay offset to increase SNR value must be applied.

If a clock of VCXO (10, 100) is 50 MHz, then it has a period of 20 ns and an offset of rising edge ranges from +10 ns to −10 ns.

Meanwhile, PLD (500) has a method that fits according to the composition tool function of VHDL and a function that can provide a delay by changing the paths. Here, when the delay is divided into nine steps of +8 ns, +6 ns, +4 ns, +2 ns, 0 ns, −2 ns, −4 ns, −6 ns, −8 ns, an option to each delay is given to the PLD source, and SNR values in the DSP may be read by applying the nine steps from +8 ns to −8 ns in sequence as follows:

AGC value of DSP for Delay −8 ns: 112a!!
    AGC value of DSP for Delay −6 ns: a95!!
    AGC value of DSP for Delay −4 ns: 9fa!!
    AGC value of DSP for Delay −2 ns: 83c!!
    AGC value of DSP for Delay 0 ns: d43!!
    AGC value of DSP for Delay +2 ns: 142a!!
    AGC value of DSP for Delay +4 ns: 1e1b!!
    AGC value of DSP for Delay +6 ns: 343c!!
    AGC value of DSP for Delay +8 ns: 1b2a!!

Since the SNR value is a signal to noise ratio value, it can be derived by comparing the ratio of signal level through the nine delay steps with the noise level of the path determined at the first step.

But, since the AGC value represents a signal level, the value for the delay of −2 ns among the nine values is the lowest which corresponds to a signal having the maximum SNR.

As described above, in the board that is tested through the two steps above, a clock source inputted from the VCXO to the DSP through the driver has the best characteristic. This can be seen that the SNR value has the optimal value when it has the delay of −2 ns.

The two steps provide switching functions that establish the path and generate the delay in the PLD and can be simply embodied using C language in the AP. Through the steps, a developer can design a final board using the path selected from the steps.

The procedures as mentioned above are illustrated with reference to the accompanying drawing.

FIG. 3 is a flow chart illustrating the method of optimizing a DSP input clock using a clock comparing/analyzing circuit according to the present invention.

As shown, the inventive method comprises the following steps of: when paths are inputted from a plurality of patterns (ST11), comparing noises of the paths (ST12); selecting a path of the lowest noise level based on the comparison result (ST13); comparing a delay offset for applying a delay offset (ST14); calculating an optimal SNR value (ST15); and determining an optimal path and delay (ST16).

The present invention relates to a method of searching an optimal clock and then automatically selecting a clock which has the best performance by comparing clocks from each pattern. In the method, the first function serves to scan all paths from a plurality of patterns individually and search a pattern having the lowest noise level. The second function serves to search the maximum SNR(Signal to Noise) value by giving a delay offset to the optimal path having the lowest noise level which is searched from the first function.

Further, the invention can apply to any system and method to determine whether any path is determined when designing the board initially as mentioned above. The delay having any value is suitable. In case of using the invention, it can be established by utilizing a circuit that has the optimal SNR value by checking its state periodically through a timer which checks its state periodically.

Alternatively, the invention can also provide a function that its state feeds back to maintain the optimal state when external environments are changed randomly and impediment elements are generated. If only a DSP is used to select any path from a plurality of paths, then the invention can be applied to connect signals between the same boards as well as different boards. If the PLD is used to insert into a backboard, then it can also select and use the path having the best characteristics among a plurality of signals passing the backboard.

Specifically, the method of the invention can provide the optimal characteristics in case peripheral environments change by checking the operation periodically through a timer and searching and connecting the optimal path.

While the present invention has been shown and described with respect to a particular method for optimizing a DSP input clock using a clock comparing/analyzing circuit, it will be apparent to those skilled in the art that many changes and modifications may be made without departing from the scope of the invention as defined in the appended claims and those equivalent thereto.

The invention claimed is:

1. A method comprising:
 a circuit comparing noise levels of a plurality of paths between a clock and a digital signal processor (DSP) and thereby selecting a path of the lowest noise level, wherein the plurality of paths have respective patterns;
 the circuit applying a plurality of delay offsets to the selected path;
 the circuit determining a signal-to-noise ratio (SNR) value on the selected path during application of one or more of the plurality of delay offsets; and
 the circuit comparing the determined SNR values and thereby selecting a delay offset corresponding to a maximum SNR value on the selected path.

2. The method of claim 1, wherein determining the SNR value on the selected path during application of a delay offset comprises determining a ratio of a signal level of the selected path during application of the delay offset with the noise level of the selected path.

3. The method of claim 1, wherein comparing the noise levels of the plurality of paths between the clock and the DSP and thereby selecting the path of the lowest noise level, applying a plurality of delay offsets to the selected path, determining the SNR value on the selected path during application of the one or more of the plurality of delay offsets, and comparing the determined SNR values and thereby selecting a delay offset corresponding to a maximum SNR on the selected path occur periodically according to a timer.

4. The method of claim 1, further comprising:
 the circuit connecting the clock to the DSP over the selected path; and
 the circuit applying the selected delay offset to the selected path.

5. The method of claim 1, wherein comparing the noise levels of the plurality of paths between the clock and the DSP and thereby selecting the path of the lowest noise level comprises comparing the AGC gains of the plurality of paths between the clock and the DSP and thereby selecting the path of the highest AGC gain.

6. A circuit configured to:
 compare noise levels of a plurality of paths between a clock and a digital signal processor (DSP) and thereby select a path of the lowest noise level, wherein the plurality of paths have respective patterns;
 apply a plurality of delay offsets to the selected path;
 determine a signal-to-noise ratio (SNR) value on the selected path during application of one or more of the plurality of delay offsets; and
 compare the determined SNR values and thereby select a delay offset corresponding to a maximum SNR value on the selected path.

7. The circuit of claim 6, wherein the circuit configured to determine the SNR value on the selected path during application of a delay offset comprises the circuit configured to determine a ratio of a signal level of the selected path during application of the delay offset with the noise level of the selected path.

8. The circuit of claim 6, wherein the circuit is configured to compare the noise levels of the plurality of paths between the clock and the DSP and thereby select the path of the lowest noise level, apply a plurality of delay offsets to the selected path, determine the SNR value on the selected path during application of the one or more of the plurality of delay offsets, and compare the determined SNR values and thereby select a delay offset corresponding to a maximum SNR on the selected path periodically according to a timer.

9. The circuit of claim 6, wherein the circuit is further configured to:
 connect the clock to the DSP over the selected path; and
 apply the selected delay offset to the selected path.

10. The circuit of claim 6, wherein the circuit configured to compare the noise levels of the plurality of paths between the clock and the DSP and thereby select the path of the lowest noise level comprises the circuit configured to compare the AGC gains of the plurality of paths between the clock and the DSP and thereby select the path of the highest AGC gain.

11. The circuit of claim of claim 6, wherein the circuit comprises a programmable logic device (PLD) coupled between the clock and the DSP.

12. The circuit of claim of claim 6, wherein the circuit comprises the DSP.

13. An apparatus comprising:
 means for comparing noise levels of a plurality of paths between a clock and a digital signal processor (DSP) and thereby selecting a path of the lowest noise level, wherein the plurality of paths have respective patterns;
 means for applying a plurality of delay offsets to the selected path;
 means for determining a signal-to-noise ratio (SNR) value on the selected path during application of one or more of the plurality of delay offsets; and
 means for comparing the determined SNR values and thereby selecting a delay offset corresponding to a maximum SNR value on the selected path.

14. The apparatus of claim 13, wherein the means for determining the SNR value on the selected path during application of a delay offset comprises means for determining a ratio of a signal level of the selected path during application of the delay offset with the noise level of the selected path.

15. The apparatus of claim 13, wherein the means for comparing the noise levels of the plurality of paths between the clock and the DSP and thereby selecting the path of the lowest noise level, applying a plurality of delay offsets to the selected path, determining the SNR value on the selected path during application of the one or more of the plurality of delay offsets, and comparing the determined SNR values and thereby selecting a delay offset corresponding to a maximum SNR on the selected path comprise means for comparing the noise levels of the plurality of paths between the clock and the DSP and thereby selecting the path of the lowest noise level, applying a plurality of delay offsets to the selected path, determining the SNR value on the selected path during application of the one or more of the plurality of delay offsets, and comparing the determined SNR values and thereby selecting a delay offset corresponding to a maximum SNR on the selected path periodically according to a timer.

16. The apparatus of claim 13, further comprising:
means for connecting the clock to the DSP over the selected path; and
means for applying the selected delay offset to the selected path.

17. The apparatus of claim 13, wherein the means for comparing the noise levels of the plurality of paths between the clock and the DSP and thereby select the path of the lowest noise level comprises means for comparing the AGC gains of the plurality of paths between the clock and the DSP and thereby select the path of the highest AGC gain.

18. A non-transitory computer-readable medium having instructions stored thereon, the instructions comprising:
instructions for comparing noise levels of a plurality of paths between a clock and a digital signal processor (DSP) and thereby selecting a path of the lowest noise level, wherein the plurality of paths have respective patterns;
instructions for applying a plurality of delay offsets to the selected path;
instructions for determining a signal-to-noise ratio (SNR) value on the selected path during application of one or more of the plurality of delay offsets; and
instructions for comparing the determined SNR values and thereby selecting a delay offset corresponding to a maximum SNR value on the selected path.

19. The computer-readable medium of claim 18, wherein the instructions for comparing the noise levels of the plurality of paths between the clock and the DSP and thereby selecting the path of the lowest noise level, applying a plurality of delay offsets to the selected path, determining the SNR value on the selected path during application of the one or more of the plurality of delay offsets, and comparing the determined SNR values and thereby selecting a delay offset corresponding to a maximum SNR on the selected path comprise instructions for comparing the noise levels of the plurality of paths between the clock and the DSP and thereby selecting the path of the lowest noise level, applying a plurality of delay offsets to the selected path, determining the SNR value on the selected path during application of the one or more of the plurality of delay offsets, and comparing the determined SNR values and thereby selecting a delay offset corresponding to a maximum SNR on the selected path periodically according to a timer.

20. The tangible computer-readable medium of claim 18, further comprising:
instructions for connecting the clock to the DSP over the selected path; and
instructions for applying the selected delay offset to the selected path.

* * * * *

UNITED STATES PATENT AND TRADEMARK OFFICE
CERTIFICATE OF CORRECTION

| | | |
|---|---|---|
| PATENT NO. | : 7,917,794 B2 | Page 1 of 1 |
| APPLICATION NO. | : 10/545505 | |
| DATED | : March 29, 2011 | |
| INVENTOR(S) | : Shin | |

It is certified that error appears in the above-identified patent and that said Letters Patent is hereby corrected as shown below:

Column 6, line 35, in Claim 11, delete "of claim of claim 6," and insert -- of claim 6, --.

Column 6, line 38, in Claim 12, delete "of claim of claim 6," and insert -- of claim 6, --.

Signed and Sealed this
Ninth Day of August, 2011

David J. Kappos
*Director of the United States Patent and Trademark Office*